United States Patent
Kikuchi et al.

(10) Patent No.: US 10,375,836 B2
(45) Date of Patent: Aug. 6, 2019

(54) FILM AND FLEXIBLE METAL-CLAD LAMINATE

(71) Applicant: KANEKA CORPORATION, Osaka (JP)

(72) Inventors: Takashi Kikuchi, Otsu (JP); Yasutaka Kondo, Otsu (JP)

(73) Assignee: KANEKA CORPORATION, Osaka (JP)

( * ) Notice: Subject to any disclaimer, the term of this patent is extended or adjusted under 35 U.S.C. 154(b) by 0 days.

(21) Appl. No.: 15/866,547

(22) Filed: Jan. 10, 2018

(65) Prior Publication Data

US 2018/0132362 A1 May 10, 2018

Related U.S. Application Data

(60) Continuation of application No. 15/057,934, filed on Mar. 1, 2016, now Pat. No. 9,900,994, which is a division of application No. 12/531,548, filed as application No. PCT/JP2008/054337 on Mar. 11, 2008.

(30) Foreign Application Priority Data

Mar. 20, 2007 (JP) .................. 2007-072100
Oct. 15, 2007 (JP) .................. 2007-267830

(51) Int. Cl.
| | |
|---|---|
| H05K 3/38 | (2006.01) |
| C09J 7/25 | (2018.01) |
| H05K 3/14 | (2006.01) |
| H05K 3/06 | (2006.01) |
| B32B 15/08 | (2006.01) |
| C08G 73/10 | (2006.01) |
| C09J 179/08 | (2006.01) |
| H05K 1/03 | (2006.01) |
| B32B 7/12 | (2006.01) |
| B32B 15/18 | (2006.01) |
| B32B 15/20 | (2006.01) |
| B32B 27/08 | (2006.01) |
| B32B 27/20 | (2006.01) |
| B32B 27/28 | (2006.01) |
| H05K 3/18 | (2006.01) |

(52) U.S. Cl.
CPC .............. *H05K 3/386* (2013.01); *B32B 7/12* (2013.01); *B32B 15/08* (2013.01); *B32B 15/18* (2013.01); *B32B 15/20* (2013.01); *B32B 27/08* (2013.01); *B32B 27/20* (2013.01); *B32B 27/281* (2013.01); *C08G 73/105* (2013.01); *C08G 73/1046* (2013.01); *C08G 73/1067* (2013.01); *C08G 73/1071* (2013.01); *C09J 7/25* (2018.01); *C09J 179/08* (2013.01); *H05K 1/0346* (2013.01); *H05K 3/06* (2013.01); *H05K 3/146* (2013.01); *H05K 3/18* (2013.01); *B32B 2255/10* (2013.01); *B32B 2255/205* (2013.01); *B32B 2255/26* (2013.01); *B32B 2307/306* (2013.01); *B32B 2307/546* (2013.01); *B32B 2307/704* (2013.01); *B32B 2307/7265* (2013.01); *B32B 2457/08* (2013.01); *C09J 2201/622* (2013.01); *C09J 2479/08* (2013.01); *C09J 2479/086* (2013.01); *H05K 1/036* (2013.01); *H05K 1/0393* (2013.01); *H05K 2201/0129* (2013.01); *H05K 2201/0154* (2013.01); *H05K 2201/0355* (2013.01); *Y10T 428/2896* (2015.01)

(58) Field of Classification Search
CPC .... C08G 73/1071; C08G 73/105; B32B 15/08
See application file for complete search history.

(56) References Cited

U.S. PATENT DOCUMENTS

| | | |
|---|---|---|
| 6,476,182 B1 | 11/2002 | Auman et al. |
| 2003/0072954 A1 | 4/2003 | Ozawa et al. |
| 2009/0056995 A1 | 3/2009 | Maeda et al. |

(Continued)

FOREIGN PATENT DOCUMENTS

| | | |
|---|---|---|
| JP | 02-180682 | 7/1990 |
| JP | 09-055568 | 2/1997 |
| JP | 2000-129228 | 5/2000 |

(Continued)

OTHER PUBLICATIONS

Non-Final Office Action for U.S. Appl. No. 12/531,548 dated Nov. 27, 2015 (15 pages).

(Continued)

*Primary Examiner* — William H. Mayo, III
*Assistant Examiner* — Hiram E Gonzalez
(74) *Attorney, Agent, or Firm* — Oblon, McClelland, Maier & Neustadt, L.L.P.

(57) ABSTRACT

A film and a flexible metal-clad laminate obtained with the film. The laminate is improved in post-moisture absorption solderability. The film comprises a heat-resistant polyimide film and, disposed on at least one side thereof, an adhesive layer containing a thermoplastic polyimide. It is characterized in that the thermoplastic polyimide contained in the adhesive layer has crystallinity and that the film, when analyzed with a differential scanning calorimeter, has an endothermic peak attributable to the melting of the crystalline thermoplastic polyimide, the absolute value of the area of the peak being 4.0 mJ/mg or larger. The flexible metal-clad laminate is characterized by comprising the film and a metal layer disposed thereon.

13 Claims, No Drawings

(56) References Cited

U.S. PATENT DOCUMENTS

2009/0280339 A1* 11/2009 Tsuda ................ B32B 15/08
428/458

FOREIGN PATENT DOCUMENTS

| | | |
|---|---|---|
| JP | 2001-260272 | 9/2001 |
| JP | 2001-270037 | 10/2001 |
| JP | 2004-209680 | 7/2004 |
| JP | 2006-312727 | 11/2006 |
| JP | 2006-321983 | 11/2006 |
| JP | 2008-023760 | 2/2008 |
| JP | 2008-149549 | 7/2008 |

OTHER PUBLICATIONS

Final Office Action for U.S. Appl. No. 12/531,548 dated Jan. 28, 2015 (18 pages).
Non-Final Office Action for U.S. Appl. No. 12/531,548 dated Jun. 6, 2014 (14 pages).
Final Office Action for U.S. Appl. No. 12/531,548 dated Jan. 30, 2014 (14 pages).
Non-Final Office Action for U.S. Appl. No. 12/531,548 dated Jul. 5, 2013 (13 pages).
Final Office Action for U.S. Appl. No. 12/531,548 dated Nov. 28, 2012 (12 pages).
Non-Final Office Action for U.S. Appl. No. 12/531,548 dated Apr. 12, 2012 (15 pages).
International Search report for PCT/JP2008/054337 dated Apr. 15, 2008 (one page).
International Preliminary Report on Patentability for PCT/JP2008/054337 dated Sep. 22, 2009 (six pages).

* cited by examiner

FILM AND FLEXIBLE METAL-CLAD LAMINATE

CROSS REFERENCES TO RELATED APPLICATIONS

This application is a continuation of U.S. patent application ser. No. 15/057,934, filed Mar. 1, 2016, which is a divisional of U.S. patent application Ser. No. 12/531,548, filed Sep. 16, 2009, now abandoned, which is the U.S. National Stage of the International Patent Application No. PCT/JP2008/054337, filed Mar. 11, 2008. The disclosures of all of the above applications are incorporated here-1in by reference in their entireties. This application claims priority to Japanese Application No. 2007-072100, filed Mar. 20, 2007, and Japanese Application No. 2007-267830, filed Oct. 15, 2007. The disclosures of all of the above applications are incorporated herein by reference in their entireties.

TECHNICAL FIELD

The present invention relates to a film and a flexible metal-clad laminate comprising the film and a metal layer on the film, which flexible metal-clad laminate is excellent in solderability after moisture absorption (post-moisture absorption solderability).

BACKGROUND ART

Recently electronic devices have been rapidly improved to have better properties, greater functionality, and smaller sizes. To cope with the improvement of the electronic devices, electronic components to be mounted on the electronic devices have been facing increasing demands to be smaller in size and lighter in weight. Accordingly, semiconductor element packaging techniques and circuit boards to which semiconductors are to be mounted are also required to be able to give greater density, functionality, and properties to the electronic devices.

Flexible printed circuit boards (hereinafter, may be referred to as FPCs) generally have such a structure that includes (i) a metal-clad laminate on which a circuit pattern is formed, and (ii) a cover layer on the circuit pattern. The metal-clad laminate includes a thin and flexible insulating film as a substrate (base film), and a metal foil bonded to the substrate via an adhesive of various kinds by thermal compression bonding. In such three-layered flexible printed circuit boards (3-layered FPC) having three layers (insulating film, adhesive layer, and metal foil), a polyimide films and the like are used as the insulating film conventionally. This is because polyimide is excellent in heat resistance, electric properties, etc. As to the adhesive layer, thermally-curing adhesive agents of epoxy resin type, acrylic resin type, etc. are generally used.

In order to attain such an FPC greater in density, functionality, and properties, the insulating adhesive agent and the insulating film used as the components of the FPC should also be greater in properties. More specifically, the adhesive layer etc. are required to be high in heat resistance and mechanical strength, and further to be excellent in processability, adhesion, electric properties, and size stability and be low in moisture absorption.

Regarding these points, the thermally-curing resins such as epoxy resin, acrylic resin used as the adhesive layer have such conventional advantages that they are excellent in low temperature processability which allows bonding at relatively low temperatures. Further, the conventional thermally-curing resins are highly economical conventionally. However, the thermally-curing resins are insufficient conventionally in terms of the other properties such as heat resistance etc. for example.

In order to solve the problem, a two-layer FPCs have been proposed in which an adhesive layer is also made of a polyimide material (see, Patent Literature 1, for example). Note that the FPCs whose adhesive layer is made of a polyimide material may be regarded as a three-layered FPC in a strict sense, but two polyimide layers are regarded as a single layer, thereby considering the FPCs of this type as being "two-layered". The two-layered FPC, which is greater in heat resistance, electric properties, and size stability than the three-layered FPCs whose adhesive layer is made of epoxy resin or acryl resin, are expected as components that can satisfy future demands in properties.

On the other hand, the use of a polyimide material is disadvantageously associated with high water absorption coefficient due to properties of polyimide. The two-layered FPCs are also associated with this problem. A FPC with a high water absorption coefficient would adversely affect component mounting process in which soldering is used. More specifically, moisture taken into the polyimide material from atmosphere is rapidly discharged from the polyimide material by heat applied during the component mounting process. This results in swelling or whitening of the FPC, and further leading to adhesion or electric property between members of the FPC. In order to avoid such problems associated with the post-moisture absorption solderability, it is possible that the FPC is preliminary-dried before a mounting process so as to remove moisture from the FPC; however, this measure involves a problem of productivity, since the measure causes an increase in the number of processes.

In order to solve the problem, an adhesive film it has been proposed, in which a property of thermoplastic polyimide used in the adhesive layer is controlled. Specifically, moisture content incorporated in the adhesive film is reduced by increasing a glass transition temperature of the thermoplastic polyimide contained in the adhesive film provided on one or both sides of a heat-resistant base film so as to improve the heat resistance of adhesive layer, thereby lowering the water absorption coefficient (see, Patent Literature 2 or Patent Literature 3, for example). A measure to be taken during production processes has been proposed. This is to remove moisture by preliminary-drying the adhesive film when the adhesive film and the metal foil are bonded with each other (see, Patent Literature 4, for example).

These methods improve post-moisture absorption solderability, which has been an disadvantage associated with a polyimide material. However, a lead-free soldering is becoming more likely to be employed for semiconductor packaging, because of recent increasing awareness of environmental issues. Since the lead-free soldering has a melting point approximately 40° C. higher than that of an existing eutectic solder, materials to be used in the mounting process are to be inevitably subjected to a higher temperature. Accordingly, the materials are now required higher post-moisture absorption solderability as compared to the conventional case. Further, when the material is used for the purpose of multilayer FPC, moisture is more likely to be contained inside the material due to a multi-layered structure. This results in a state where the multilayer FPC is prone to defects at a lower solder temperature than that of the monolayer FPC; that is, the material used in the multilayer FPC is required further higher post-moisture absorption solderability.

CITATION LIST

Patent Literature 1
Japanese Patent Application Publication, Tokukaihei, No. 2-180682 A
Patent Literature 2
Japanese Patent Application Publication, Tokukai, No. 2000-129228 A
Patent Literature 3
Japanese Patent Application Publication, Tokukai, No. 2001-260272 A
Patent Literature 4
Japanese Patent Application Publication, Tokukai, No. 2001-270037 A

SUMMARY OF INVENTION

Technical Problem

The present invention has been made in view of the foregoing problems, and it is an object of the present invention to provide (i) a film that is excellent in post-moisture absorption solderability and (ii) a flexible metal-clad laminate produced by use of the film, by controlling a property of a thermoplastic polyimide that is used as an adhesive agent.

Solution to Problem

The inventors of the present invention has been diligently studied in view of the foregoing problems, and found that it is possible to improve the post-moisture absorption solderability of the film and the flexible metal-clad laminate produced by use of the film, by for example adding a crystallinity to the thermoplastic polyimide that is used as the adhesive agent and then controlling the crystallinity. As a result, the inventors have accomplished the present invention.

That is, a first aspect of the present invention relates to a film comprising an adhesive layer on at least one side surface of a heat-resistant polyimide film, the adhesive layer containing a thermoplastic polyimide, the thermoplastic polyimide being a crystalline thermoplastic polyimide, the film being such that an absolute value of an endothermic peak area attributed to melting of the crystalline thermoplastic polyimide is 4.0 mJ/mg or higher, the endothermic peak area being measured by performing a differential scanning calorimetry on the film.

A preferable embodiment relates to the film, wherein an absolute value of an exothermic peak area attributed to recrystallization of the crystalline thermoplastic polyimide is 4.0 mJ/mg or lower, the exothermic peak area being measured by performing the differential scanning calorimetry on the film.

A preferable embodiment relates to one of the aforementioned films, wherein the thermoplastic polyimide has a melting point within a range of 340° C. to 450° C.

A preferable embodiment relates to one of the aforementioned films, wherein a water absorption coefficient of the heat-resistant polyimide film is 1.5% or lower.

A preferable embodiment relates to one of the aforementioned films, wherein the crystalline thermoplastic polyimide is obtainable by imidizing a polyamic acid composed from a combination of a diamine component and a dianhydride component, the diamine component being selected from the group consisting of 1,4-bis(4-amino phenoxy)benzene; 1,3-bis(4-aminophenoxy)benzene; 4,4'-bis(3-aminophenoxy)biphenyl; 4,4'-bis(4-aminophenoxy)biphenyl; 1,4-diaminobenzene; and 3,4'-diaminodiphenyl ether, the dianhydride component being selected from the group consisting of pyromellitic dianhydride; 3,3',4,4'-biphenyl tetra carboxylic dianhydride; and 3,3',4,4'-benzophenone tetra carboxylic dianhydride.

A preferable embodiment relates to one of the aforementioned films, wherein the crystalline thermoplastic polyimide is contained in an amount of 85 to 100 wt % with respect to the thermoplastic polyimide contained in the adhesive layer.

A preferable embodiment relates to one of the aforementioned films, wherein the crystalline thermoplastic polyimide is obtainable by imidizing a polyamic acid obtained through the following steps (a) to (c):

(a) a step for obtaining a prepolymer having an amino group or an acid anhydride group at both ends by reacting an aromatic diamine with an aromatic dianhydride in an organic polar solvent under a condition where the aromatic diamine or the aromatic dianhydride is contained in excess;

(b) a step for further adding (i) an aromatic diamine having a different structure from the aromatic diamine used in (a) or (ii) an aromatic dianhydride having a different structure from the aromatic dianhydride used in (a); and (c) a step for further adding (i) the aromatic diamine having the different structure from the aromatic diamine used in (a) or (ii) the aromatic dianhydride having the different structure from the aromatic dianhydride used in (a) so that the aromatic diamine and the aromatic dianhydride are contained in a substantially equimolar amount throughout all steps and then performing polymerization.

A preferable embodiment relates to the film, wherein the crystalline thermoplastic polyimide is obtainable by imidizing a polyamic acid obtained through the following steps (a) to (c):

(a) a step for obtaining a prepolymer having amino groups at both ends by reacting the aromatic diamine with the aromatic dianhydride in the organic polar solvent under a condition where the aromatic diamine is contained in excess;

(b) a step for further adding the aromatic diamine having a different structure from the aromatic diamine used in (a); and (c) a step for further adding the aromatic dianhydride having a different structure from the aromatic dianhydride used in (a) so that the aromatic diamine and the aromatic dianhydride are contained in a substantially equimolar amount throughout all steps and then performing polymerization.

A preferable embodiment relates to the film, the crystalline thermoplastic polyimide is obtainable by imidizing a polyamic acid obtained through the following steps (a) to (c):

(a) a step for obtaining a prepolymer having acid anhydride groups at both ends by reacting the aromatic diamine with the aromatic dianhydride in the organic polar solvent under a condition where the aromatic dianhydride is contained in excess;

(b) a step for further adding an aromatic dianhydride having a different structure from the aromatic dianhydride used in (a); and (c) a step for further adding the aromatic diamine having a different structure from the aromatic diamine used in (a) so that the aromatic diamine and the aromatic dianhydride are contained in a substantially equimolar amount throughout all steps and then performing polymerization.

A preferable embodiment relates to one of the aforementioned films, wherein the crystalline thermoplastic polyimide contained in the adhesive layer has a melting point at least 5° C. lower than a crystalline thermoplastic polyimide obtainable by imidizing (i) a polyamic acid obtained through a polymerization performed so that the aromatic diamine used in the step (a) and the aromatic dianhydride used in the step (a) are contained in a substantially equimolar amount or (ii) a polyamic acid obtained through a polymerization performed so that the aromatic diamine used in the steps (b) and (c) and the aromatic dianhydride used in the steps (b) and (c) are contained in a substantially equimolar amount.

A preferable embodiment relates to one of the aforementioned films, wherein the crystalline thermoplastic polyimide has a melting point within a range of 340° C. to 380° C.

A second aspect of the present invention relates to a flexible metal-clad laminate comprising one of the aforementioned films and a metal layer formed on at least one side surface of the film.

A preferable embodiment relates to the flexible metal-clad laminate, which meets both of the following conditions (i) and (ii):

(i) a peeling strength for the metal layer is 10 N/cm or greater, where a force to peel the metal layer is applied in a 180 degrees direction; and (ii) defective appearance such as swelling and whitening does not occur even if being exposed under a moisture condition of 40° C. of temperature and 90% R.H. for 96 hours and thereafter immersed in solder dip of 300° C. for 10 seconds.

A preferable embodiment relates to one of the aforementioned flexible metal-clad laminates, wherein the film resulting from removal of the metal layer provided on the film by etching etc. is such that (i) an absolute value of an endothermic peak area attributed to melting of the crystalline thermoplastic polyimide is 4.0 mJ/mg or higher, the endothermic peak area being measured by performing a differential scanning calorimetry on the film, and (ii) an absolute value of an exothermic peak area attributed to recrystallization of the crystalline thermoplastic polyimide is 0.5 mJ/mg or lower, the exothermic peak area being measured by performing the differential scanning calorimetry on the film.

Advantageous Effects of Invention

The film obtainable in the present invention and a flexible metal-clad laminate produced by bonding a metal foil to the film are excellent in post-moisture absorption solderability and workability.

DESCRIPTION OF EMBODIMENTS

Embodiments of the present invention are described as follows.

A film according to the present invention comprises a heat-resistant polyimide film and an adhesive layer on at least one side of the heat-resistant polyimide film, the adhesive layer containing a thermoplastic polyimide. The thermoplastic polyimide is a crystalline thermoplastic polyimide wholly or partially at least by a certain amount.

In the present invention, being "crystalline" means that the thermoplastic polyimide shows a clear endothermic peak (whose peak temperature is considered as a melting point) by Differential Scanning Calorimetry (DSC) when the thermoplastic polyimide is transited from solid state to melting state. On the other hand, a non-crystalline thermoplastic polyimide has no melting point. Therefore, the non-crystalline thermoplastic polyimide shows no endothermic peak clearly but subtle heat absorption around its glass transition temperature.

The "heat-resistant polyimide" used in the film of the present invention comprises a non-thermoplastic polyimide by 90 wt % or more. The non-thermoplastic polyimide is not particularly limited in terms of its molecular structure and thickness. The non-thermoplastic polyimide used to form the heat-resistant polyimide is generally prepared from a polyamic acid as a precursor. The non-thermoplastic polyimide may be completely imidized or may partly contain the polyamic acid, which is the precursor that has not been imidized. Here, the non-thermoplastic polyimide is a polyimide that is not thermally softened to be adhesive. In the present invention, the non-thermoplastic polyimide is a polyimide that is not wrinkled or elongated, and thereby keeps its shape after being heated at 450° C. for 2 minutes, or is a polyimide that has no glass transition temperature substantially. The glass transition temperature can be determined from a flexion point of a storage elasticity measured by Dynamic Viscoelastic Property (Dynamic Mechanical Analysis: DMA). Moreover, "having no glass transition temperature substantially" means that the polyimide starts its pyrolysis before moving into its glass transition state.

The heat-resistant polyimide film may have any thickness as appropriate to its usage. In general two-layered FPCs, an insulating layer (heat-resistant polyimide film and adhesive layer in total) has a thickness of 1 mil (25 μm) or a half mil (12.5 μm) preferably. Thus, it is preferable that the heat-resistant polyimide film has a thickness of 7 to 18 μm.

Heat-resistant polyimide films applicable to the film of the present invention are not particularly limited, and commercially available well-known polyimide films can be used as the heat-resistant polyimide film for the film of the present invention. Examples of the commercially available polyimide films are "Apical" (made by Kaneka corp.), "Kapton" (made by DUPONT-TORAY Co. Ltd.), "Upilex" (made by Ube Industries, Ltd), etc.) Needless to say, a heat-resistant polyimide film appropriately made by a conventionally known raw materials or method, etc. may be employed. For example, the heat-resistant polyimide film may be produced from varnish of a polyamic acid, which is prepared in such a manner that an aromatic tetra carboxylic dianhydride and an aromatic diamine in substantially equimolar amounts are dissolved in an organic solvent and stirred at a controlled temperature until polymerization of the aromatic tetra carboxylic dianhydride and the aromatic diamine is completed, thereby to produce the varnish of the polyamic acid that is a precursor.

As described above, polyimide is a material having a high water absorption among plastic. As a raw material of FPC, the heat-resistant polyimide film preferably has a lower water absorption coefficient in order to attain better post-moisture absorption solderability. More specifically, a heat-resistant polyimide film with a water absorption coefficient of 1.5% or lower is preferable. A heat-resistant polyimide film with a water absorption coefficient of 1.3% or lower is more preferable. The use of such a heat-resistant polyimide film with low water absorption coefficient makes it possible to lower absolute amount of moisture moving inside the material during soldering immersion. This improves post-moisture absorption solderability.

In order to give the film a lower water absorption coefficient, it is necessary to lower water absorption coefficients of the heat-resistant polyimide film and the adhesive layer, respectively. More specifically, for example, this can be attained by (i) using a material a silicone skeleton or fluorine-type functional group, (ii) dispersing polarity of imide group by introducing a polar group such as ester group in a molecular skeleton, (iii) by using a material having a relatively large molecular amount, so as to reduce an amount of imide groups per weight.

The adhesive layer of the film of the present invention comprises the thermoplastic polyimide. The thermoplastic polyimide is a crystalline thermoplastic polyimide wholly or partially at least by a certain amount.

In general, non-crystalline thermoplastic polyimides show sudden drop in storage elasticity around theirs glass transition temperatures, so as to be softened. Therefore, in case where the thermoplastic polyimide constituting the adhesive layer of the film is non-crystalline purely, the softening causes abrupt moisture discharge from the film via the adhesive layer to outside. This would cause whitening or swelling of the film and the flexible metal-clad laminate. In order to prevent this, the glass transition temperature of the thermoplastic polyimide should be as high as temperature used in the component mounting process using solder. On the other hand, the adhesive layer should be soft enough to be adhesive, at the temperature at which the film and the metal foil are bonded together in the manufacturing process of the flexible metal-clad laminate. For the sake of good productivity in bonding the film with the metal foil, it is necessary to bond the film with the metal foil at a temperature higher than the glass transition temperature of the thermoplastic polyimide of the adhesive layer by 80° C. to 150° C. Therefore, such a demand for post-moisture absorption solderability at higher temperatures tends to make it more difficult to attain a flexible metal-clad laminate in which the post-moisture absorption solderability and processability are both satisfied.

On the other hand, crystalline thermoplastic polyimides also show drop in storage elasticity around their glass transition temperatures, but the drop in storage elasticity is not as large as these of the non-crystalline thermoplastic polyimides. Further, the storage elasticity of the crystalline thermoplastic polyimide generally tends to drop around melting points that are higher than the glass transition temperature. Thus, compared with the case of the adhesive layer made of a non-crystalline thermoplastic polyimide, the use of the adhesive layer made of a crystalline thermoplastic polyimide makes it easier to attain both the post-moisture absorption solderability and the processability. Conventionally, the crystalline thermoplastic polyimides have been used in shaping applications such as melt extrusion, injection molding. However, there are only few examples of application of the crystalline thermoplastic polyimides in electronic material applications (to which the present invention pertains) in a technical field different from that of the shaping applications. Japanese Patent Application Publication, Tokukai, No. 2004-209680 uses various thermoplastic polyimides in order to attain a polyimide metal-clad layer improved in peel strength even though a metal foil having a low degree of roughness. Among the thermoplastic polyimides, two thermoplastic polyimides having melting points (Tm) are described, even though the two thermoplastic polyimides are not described in terms of their crystallinity. Further, Japanese Patent Application Publication, Tokukai, No. 2004-209680 merely describes a laminate that is formed by bonding vanish applied and dried on a copper foil, to an insulating film with adhesive layer thereon. Thus, Japanese Patent Application Publication, Tokukai, No. 2004-209680 is silent in relationship between post-moisture absorption solderability and the crystallinity of the thermoplastic polyimide.

Moreover, apart from the use of the crystalline thermoplastic polyimide to the adhesive layer of the film, the diligent studies of the inventors of the present invention found that it is important for the improvement of the post-moisture absorption solderability that a crystalline state of the thermoplastic polyimide be controlled. This is described below in more details.

The imidization of the precursor of the thermoplastic polyimide is carried out with heat application. Depending on heating history during the heat application, a crystalline state of the thermoplastic polyimide contained in the adhesive layer of the resultant film can be determined. For example, in order to attain a high soldering heat resistance for producing a flexible metal-clad laminate by bonding the metal foil to the film, it is preferable that the thermoplastic polyimide be crystallized to some extent or more before the metal foil is bonded to the film. More specifically, it is preferable to use a film in which an absolute value of endothermic peak area due to melting of the crystalline thermoplastic polyimide is 4.0mJ/mg or more according to differential scanning calorimetery of the film. It is further preferable to use a film in which the absolute value of the endothermic peak area due to the melting of the crystalline thermoplastic polyimide is 5.0mJ/mg or more. The use of such a film produces a flexible metal-clad laminate with excellent post-moisture absorption solderability. There is no particular limitation as to an upper limit of the endothermic peak. However, it is preferable that the upper limit is 12.0mJ/mg or less, because, as described later, the productivity can be controlled easily when the thermoplastic polyimide is non-crystalline in part.

Moreover, for the sake of excellent post-moisture absorption solderability, it is preferable to use a film in which an absolute value of exothermic peak area due to recrystallization of the crystalline thermoplastic polyimide is 4.0mJ/mg or less. It is preferable to use a film in which the absolute value of the exothermic peak area due to the recrystallization of the crystalline thermoplastic polyimide is 3.0 mJ/mg or less. There is no particular limitation as to a lower limit of the exothermic peak. However, it is preferable that the upper limit is 0.2mJ/mg or more, because, as described later, the productivity can be controlled easily when the thermoplastic polyimide is non-crystalline in part.

The area of the endothermic peak due to the melting of the crystalline thermoplastic polyimide according to differential scanning calorimetery of the film is an index of proceeding of the crystallization of the thermoplastic polyimide. In general, it is determined that the crystallization has been proceeded further when the peak area is greater and peak shape is sharper. On the other hand, the area of the exothermic peak due to the recrystallization of the crystalline thermoplastic polyimide is also an index of proceeding of the crystallization of the thermoplastic polyimide. As to the peak area due to recrystallization, the heat of the differential scanning calorimetery causes crystallization, which generates heat to observe. Thus, it is determined that the crystallization has been proceeded further if the generation peak area due to the recrystallization is smaller. The endothermic peak and the exothermic peak can be determined according to the heating history during the film production. This is described later in details.

The crystalline thermoplastic polyimide contained in the adhesive layer of the film of the present invention can be obtained via the imidization of a polyamic acid, which is a precursor thereof. The polyamic acid can be prepared by any method, and may be prepared by using a conventionally known method. One general example of the method comprises mixing a diamine component and an acid dianhydride component in an organic solvent and performing polymerization with the diamine component and the acid dianhydride component so as to prepare an organic solvent solution of polyamic acid. By selecting appropriate structures for the diamine component and the acid dianhydride component, it is possible to give crystallinity to the thermoplastic polyimide obtained through the imidization of the polyimide acid obtained via the polymerization of the diamine component and the acid dianhydride component. However, as described above, polyimide is obtained from polymerization of a diamine component and an acid dianhydride component. Thus, use of only one of the particular diamine component and acid dianhydride component does not promise crystallinity of the polyimide. The use of the particular diamine component and acid dianhydride component in combination determines whether the crystallinity of the polyimide is attained or not.

Being aware of the importance of the combination, examples of the diamine component and the acid anhydride component usable as raw materials of the crystalline thermoplastic polyimide contained in the adhesive layer of the film of the present invention are given below. Preferable examples of the diamine component are: ether diamines such as 1,4-bis(4-aminophenoxy)benzene, 1,3-bis(4-aminophenoxy)benzene, 4,4'-bis(3-aminophenoxy)biphenyl, and 4,4'-bis(4-aminophenoxy)biphenyl; phenylene diamine such as 1,4-diaminobenzene; and the like. These diamine components make it easier to attain the crystallinity.

As to the acid dianhydride component, preferable examples are pyromellitic dianhydride; 3,3',4,4'-biphenyl tetra carboxylic dianhydride; and the like. Of course the diamine components and acid dianhydride components usable as the raw materials of the thermoplastic polyimide of the present invention are not limited to these examples given above. Raw materials with other structures may be used, provided that the thermoplastic polyimide attains crystallinity as a result of the combination of the diamine component and the acid dianhydride.

In the present invention, particularly preferable examples of the combinations of the diamine component and the acid dianhydride component are: a combination of 1,4-bis(4-aminophenoxy)benzene, 1,3-bis(4-aminophenoxy)benzene, and 3,3',4,4'-biphenyl tetra carboxylic dianhydride; a combination of 1,3-bis(4-aminophenoxy)benzene and 3,3',4,4'-biphenyl tetra carboxylic dianhydride; a combination of 1,3-bis(4-aminophenoxy)benzene, 3,4'-diaminodiphenyl ether, 3,3',4,4'-biphenyl tetra carboxylic dianhydride, and 3,3',4,4'-benzophenone tetra carboxylic dianhydride; and the like combinations.

In the present invention, the thermoplastic polyimide contained in the adhesive layer is a crystalline thermoplastic polyimide wholly or partly by a particular amount or more. In view of the post-moisture absorption solderability and processability, it is preferable that the crystalline thermoplastic polyimide is contained in an amount of 85 wt % to 100 wt % with respect to the thermoplastic polyimide contained in the adhesive layer. Furthermore, it is more preferable that the crystalline thermoplastic polyimide is contained in an amount of 90 wt % to 100 wt % with respect to the thermoplastic polyimide contained in the adhesive layer.

In the present invention, the polymerization of the polyamic acid that is the precursor of the thermoplastic polyimide is not particularly limited in terms of various conditions such as its organic solvent, polymerization temperature, polymerization concentration, etc., and can be carried out under conventionally well-known conditions.

How to perform the imidization of the polyamic acid thus obtained is not particularly limited. The imidization can be carried out by thermal curing method in which the imidization is carried out by use of heat only, or by chemical curing method in which a chemical curing agent including a chemical dehydrating agent and a catalyst is used. As an alternative, the thermal curing method and the chemical curing method can be employed together. This is also true for the production of the heat-resistant polyimide film, apart from the production of the thermoplastic polyimide.

The chemical dehydrator may be a dehydrating ring-closing agent. For example, the chemical dehydrator may be an aliphatic acid anhydride, an aromatic acid anhydride, N,N'-dialkyl carbodiimide, low aliphatic halide, low aliphatic acid anhydride halide, aryl sulfonic dihalide, thionyl halide, or any combination of two or more of these. Among these, the aliphatic acid anhydride and aromatic anhydride are effective particularly.

Moreover, in a broad sense, the catalyst is a substance that promotes the dehydrating ring-closure of the chemical dehydrating agent to the polyamic acid. Examples of the catalyst are aliphatic tertiary amines, aromatic tertiary amines, and hetrocyclic tertiary amines. Among these, hetrocyclic tertiary amines such as imidazol, benziimidazol, isoquinone, quinorine, and β-picoline are particularly preferable. Furthermore, where appropriate, it may be arranged such that an organic polar solvent is added to a solution of the chemical dehydrating agent and the catalyst.

As to a quantity of the chemical dehydrating agent, it is preferable that 0.5 mol to 5 mol of the chemical dehydrating agent is used per one mol of amidic acid unit in the polyamic acid contained in the solution to which the chemical dehydrating agent and the catalyst are to be added. It is more preferable that 0.7 mol to 4 mol of the chemical dehydrating agent is used per one mol of amidic acid unit in the polyamic acid contained in the solution to which the chemical dehydrating agent and the catalyst are to be added. As to a quantity of the catalyst, it is preferable that 0.05 mol to 3 mol of the catalyst is used per one mol of amidic acid unit in the polyamic acid contained in the solution to which the chemical dehydrating agent and the catalyst are to be added. It is more preferable that 0.2 mol to 2 mol of the catalyst is used per one mol of amidic acid unit in the polyamic acid contained in the solution to which the chemical dehydrating agent and the catalyst are to be added. Quantities of the chemical dehydrating agent and the catalyst lower than the ranges cause insufficient chemical imidization, which would cause tearing in the baking, or low chemical strength. Moreover, quantities of the chemical dehydrating agent and the catalyst greater than the ranges would cause excessively fast imidization, which makes it difficult to cast the polyimide into a film shape.

The film of the present invention gives the flexible metal-clad laminate excellent post-moisture absorption solderability. Thus, the crystalline thermoplastic polyimide contained in the adhesive layer preferably has a melting point high to some extent. More specifically, the melting point is preferably not less than 340° C., but not more than 450° C. Moreover, a lower limit of the melting point is preferably 350° C. or higher, more preferably 355° C. or higher, and especially preferably 360° C. or higher. On the other hand, an upper limit of the melting point is preferably 420° C. or lower, more preferably 400° C. or lower, especially preferably 385° C. or lower, and particularly 380° C. or lower. A melting point lower than the range means that the adhesive layer start to be softened at a lower temperature. This would lead to failure to attain improvement of the post-moisture absorption solderability. On the other hand, a melting point higher than the range means that for example the adhesive layer becomes insufficiently soft at the temperature at which the metal foil and film are bonded together. This would cause lower adhesion strength between the metal foil and the film.

On the other hand, as described above whether or not the crystallinity of the thermoplastic polyimide can be attained or not is highly dependent on the combination of the aromatic diamine and aromatic acid anhydride from which the thermoplastic polyimide is prepared. This means that it is not easy always to control the property of the thermoplastic polyimide. In some cases, if part of the combination of the raw materials is changed with another one in order to lower the melting point for better processability, it would cause loss or reduction of the crystallinity of the thermoplastic polyimide. This might require total change in the combination of the raw materials. The inventors of the present invention found that even in such a case, it is possible to control the melting point of the thermoplastic polyimide by controlling an order of addition of the monomers from which the crystalline thermoplastic polyimide is formed. In order to improve the processability of the film whose adhesive layer is made from a crystalline thermoplastic polyimide, it is important to obtain the crystalline thermoplastic polyimide from imidization of a polyamic acid solution obtained via the following steps (a) to (c):

(a) a step for obtaining a prepolymer having an amino group or an acid anhydride group at both ends by reacting an aromatic diamine with an aromatic dianhydride in an organic polar solvent under a condition where the aromatic diamine or the aromatic dianhydride is contained in excess;

(b) a step for further adding (i) an aromatic diamine having a different structure from the aromatic diamine used in (a) or (ii) an aromatic dianhydride having a different structure from the aromatic dianhydride used in (a); and (c) a step for further adding (i) the aromatic diamine having the different structure from the aromatic diamine used in (a) or (ii) the aromatic dianhydride having the different structure from the aromatic dianhydride used in (a) so that the aromatic diamine and the aromatic dianhydride are contained in a substantially equimolar amount throughout all steps and then performing polymerization.

More specifically, for example, in case where a polyamic acid solution in which the polyamic acid has amine terminals finally, it is possible to obtain the crystalline thermoplastic polyimide from imidization of a polyamic acid solution obtained via the following steps (a) to (c):

(a) a step for obtaining a prepolymer having amino groups at both ends by reacting the aromatic diamine with the aromatic dianhydride in the organic polar solvent under a condition where the aromatic diamine is contained in excess;

(b) a step for further adding the aromatic diamine having a different structure from the aromatic diamine used in (a); and (c) a step for further adding the aromatic dianhydride having a different structure from the aromatic dianhydride used in (a) so that the aromatic diamine and the aromatic dianhydride are contained in a substantially equimolar amount throughout all steps and then performing polymerization.

Moreover, for example, in case where a polyamic acid solution in which the polyamic acid has acid anhydride terminals finally, it is possible to obtain the crystalline thermoplastic polyimide from imidization of a polyamic acid solution obtained via the following steps (a) to (c):

(a) a step for obtaining a prepolymer having acid anhydride groups at both ends by reacting the aromatic diamine with the aromatic dianhydride in the organic polar solvent under a condition where the aromatic dianhydride is contained in excess;

(b) a step for further adding an aromatic dianhydride having a different structure from the aromatic dianhydride used in (a); and (c) a step for further adding the aromatic diamine having a different structure from the aromatic diamine used in (a) so that the aromatic diamine and the aromatic dianhydride are contained in a substantially equimolar amount throughout all steps and then performing polymerization.

Therefore, coexisted in the molecular chain of the polyamic acid thus obtained via the steps above are blocks (hereinafter, Blocks A) prepared from the raw materials used in Step (a), and blocks (hereinafter, Blocks B) prepared from the raw materials used in Step (b) or (c). By controlling the structures of Blocks A and B and a ratio between Blocks A and B, it is possible to control the melting point of "the crystalline thermoplastic polyimide obtained via the imidization of the polyamic acid" as a whole.

As to Blocks A and B, it is necessary that at least either Blocks A or B be blocks derived from a crystalline thermoplastic polyimide. It is also acceptable that both of Blocks A and B are blocks derived from crystalline thermoplastic polyimides. Whether the crystallinity appears or not is largely dependent on the combination of the diamine component and the acid dianhydride. Thus, the crystallinity can not be attained simply by selecting the structure of one of the diamine component and the acid dianhydride. In the following, examples of the diamine component and the acid dianhydride usable as the raw materials of the blocks derived from the crystalline thermoplastic polyimide are given. It should be noted that their combinations are to be considered. Preferable examples of the aromatic diamine component for easily attaining the crystallinity are Ether-type diamines such as 1,4-bis(4-aminophenoxy)benzene; 1,3-bis(4-aminophenoxy)benzene, 4,4'-bis(3-aminophenoxy) biphenyl, and 4,4'-bis(4-aminophenoxy)biphenyl; phenylene-type diamines 1,4-diaminobenzene; and the like. On the other hand, preferable examples of the aromatic acid dianhydride component for easily attaining the crystallinity are: pyromellitic dianhydride, 3,3',4,4'-biphenyl tetra carboxylic dianhydride, and the like. Needless to say, the present invention is not limited to these in terms of the aromatic diamine component and the aromatic acid dianhydride component to use. Raw materials of another structures are also usable in the present invention, provided that a thermoplastic polyimide obtained as a result of a particular combination of that aromatic diamine component and that aromatic acid dianhydride component shows crystallinity.

As to the ratio of Blocks A and B, it is necessary that the blocks derived from the crystalline thermoplastic polyimide be greater in the ratio. More specifically, the blocks derived from the crystalline thermoplastic polyimide are preferably 80 mol % or more, and more preferably 90 mol % or more. As to an upper limit of the ratio, the blocks derived from the crystalline thermoplastic polyimide are preferably 98 mol % or less, and more preferably 96 mol % or less. If the ratio is smaller than the range, the resultant thermoplastic polyimide would be poorly crystalline. On the contrary, if the ratio is greater than the range, the melting control would not be effective enough.

The case where Blocks A and B are blocks derived from the crystalline thermoplastic polyimides is preferable, because all the blocks are blocks derived from the crystalline thermoplastic polyimides. In this case, blocks whose property is to be dominant is added in the ratios mentioned above.

The thermoplastic polyimide according to the present invention obtainable via the polymerization method mentioned above can be lower in melting point preferably by 5° C. or more, and more preferably by 10° C. or more, compared with a crystalline thermoplastic polyimide obtainable from Blocks A or B solely. It is not yet understood why the polymerization method can lower only the melting point of thermoplastic polyimide without loosing the crystallinity. However, it is deduced that the sparse presence of a small amount of block component of a structure different from that of main block components in the molecular chain makes some change in the crystalline state of the polyimide as a whole.

In addition to the thermoplastic polyimide, the adhesive layer of the film according to the present invention may contain, if necessary, organic/inorganic particles such as a filler, in order to control linear thermal expansion coefficient, slidability, etc. In this case, an amount of the filler to add is 0.001 wt % to 10 wt %, and more preferably 0.01 wt % to 1.0 wt % with respect to the adhesive layer. Here, fine crystalline particles of the crystalline thermoplastic polyimide in the adhesive layer of the film according to the present invention can also play a role of lubricant. Thus, there is little need of improving the slidability. Thus, the amount of the filler can be small.

Moreover, the adhesive layer of the film according to the present invention is not limited as to its thickness, and may have any thickness as appropriate, in consideration of a thickness of the film as a whole, surface roughness of the metal layer to which the adhesive layer is to be bonded, and other conditions. For example, it is preferable that the thickness of the adhesive layer be in a range of 1 µm to 10 µm. It is more preferable that the thickness of the adhesive layer be in a range of 1.5 µm to 6 µm. A thickness of the adhesive layer thicker than these ranges does not further contribute to the adhesion strength, but makes it difficult to control the linear thermal expansion coefficient of the film. A thinner thickness of the adhesive layer thinner than these ranges would lead to defective adhesion because the adhesive layer cannot sufficiently engage with the roughness of the surface of the metal layer such as a metal foil.

The film according to the present invention may be fabricated by any method. For example, it is preferable to fabricate the film according to the present invention by (i) forming the adhesive layer on one side or both side of the heat-resistant polyimide film that serves as a core, by (ii) forming the adhesive layer into a sheet form and bonding the adhesive layer in the sheet form to the heat-resistant polyimide film that serves as the core, by (iii) forming the core layer and the adhesive layer concurrently by multi-layer extrusion or the like, or (iv) by the like method. Among these methods, when the method (i) is employed, it is sometimes difficult to provide the adhesive layer on the heat-resistant polyimide film, because if the polyamic acid that is the precursor of the thermoplastic polyimide contained in the adhesive layer was completely imidized, the polyamic acid would be less soluble in an organic solvent. In view of this, it is more preferable that a solution in which the polyamic acid that is the precursor of the thermoplastic polyimide contained in the adhesive layer is dissolved is prepared and applied on the heat-resistant polyimide film that serves as the core, and then the imidization is performed. In case where the thermoplastic polyimide is soluble, it may be so arranged that the imidization is performed in advance. Moreover, the imidization can be performed by any methods encompassing conventionally well-known methods, and is not limited to the thermal curing method or the chemical curing method.

Any methods for the imidization require heating for increasing their productivity. Thus, as described above, the heating history during the film production changes the crystallinity of the thermoplastic polyimide in the resultant film. By differential scanning calorimetery this can be observed as a difference between the endothermic peak due to the melting and the exothermic peak due to the recrystallization. The melting and recrystallization of crystals occur when heated under high temperature atmosphere at a temperature at or above the melting point of the crystalline thermoplastic polyimide contained in the adhesive layer of the film, and then cooled. Thus, by appropriately controlling a cooling rate after applying a temperature at or above the melting point, a larger endothermic peak area with a sharper shape tends to be obtained. Moreover, the appropriate control of the cooling rate is preferable also because it reduces crystal particle sizes, thereby improving the adhesive layer of the resultant film in terms of transparency. The exothermic peak due to the recrystallization tends to be smaller in its peak area when the crystallization proceeds sufficiently, by appropriately controlling the cooling rate after thermally melting the adhesive layer is controlled, more specifically by slowing the cooling rate compared with crystallization rate of the thermoplastic polyimide. The crystallization rate is dependent on the structure of the thermoplastic polyimide. Thus, it can be selected as appropriate, depending on the composition of the thermoplastic polyimide. Moreover, excessive crystallization will lower flowability of the adhesive layer. For example, this deteriorates the processability of the adhesive layer in bonding the adhesive layer to the metal layer. Therefore, the crystalline thermoplastic polyimide may be non-crystalline in part to some extent. In this case, as described above, a sufficient solder heat resistance can be ensured by controlling the absolute value of the exothermic peak area due to the recrystallization that occurs after bonding the adhesive layer to the metal foil.

The flexible metal-clad laminate according to the present invention can be attained by providing a metal layer on one side or both sides of the film. There is no particular limitation as to how to provide the metal layer. For example, the metal layer can be provided by bonding a metal foil to the film, by forming the metal layer via plating or vapor deposition, or by the like method.

As for the method in which the metal foil is bonded to the film, the metal foil usable in this method is not limited to a particular one. In case the flexible metal-clad laminate according to the present invention is employed in electronic apparatuses or electric apparatuses, a metal foil made of, for example, copper, copper alloy, stainless steel, stainless steel alloy, nickel, nickel alloy (inclusive of 42 alloy), aluminum, or aluminum alloy. The present invention can preferably employ a rolled copper foil, electrolysis copper foil, etc. which are popularly used in general flexible metal-clad laminate. Moreover, an anti-rusting layer, heat-protecting layer, or an adhesive layer may be provided on a top surface of the metal foil.

In the present invention, the metal foil is not particularly limited as to its thickness, and may have any thickness, provided that the metal foil can function sufficiently according to usage.

There is no particular limitation as to how to bond the film and the metal foil. For example, continuous treatment using (i) a heat roll laminating apparatus having one or more pairs of metal rollers or (ii) a double-belt press (DBP) may be employed. Especially, the heat roll laminating apparatus having one or more pairs of metal rollers is preferable because its structure is simple and maintenance cost is low. Here, the "heat roll laminating apparatus having one or more pairs of metal rollers" can be any apparatus having a metal roller(s) for applying heat and pressure to materials, and is not limited to particular structure in details.

It is preferable that the film and the metal foil are bonded with each other at or above a temperature that is higher than the glass transition temperature (Tg) of the thermoplastic polyimide in the adhesive layer of the film by 50° C. or more (Tg+50° C.), and at or above a temperature that is lower than the melting point (Tm) of the thermoplastic polyimide by 50° C. or more (Tm−50° C.). It is more preferable that the film and the metal foil are bonded with each other at or above a temperature is higher than Tg of the thermoplastic polyimide in the adhesive layer of the film by 100° C. or more (Tg+100° C.), and at or above a temperature that is lower than Tm of the thermoplastic polyimide by 20° C. or more (Tm−20° C.). The temperature at or above Tg+50° C. and Tm−50° C. makes it possible to good heat lamination of the film and metal foil. The temperature at or above Tg+100° C. and Tm−20° C. makes it possible to continuously bond the film with the metal foil at a higher lamination rate, thereby improving productivity.

In the flexible metal-clad laminate according to the present invention, it is very preferable that the following two conditions (i) and (ii) are satisfied:

(i) a peeling strength for the metal layer is 10 N/cm or greater, where a force to peel the metal layer is applied in a 180 degrees direction; and (ii) defective appearance such as swelling and whitening does not occur even if being exposed under a moisture condition of 40° C. of temperature and 90% R.H. for 96 hours and thereafter immersed in solder dip of 300° C. for 10 seconds.

In order to satisfy the conditions, it is preferable that the crystallinity of the adhesive layer after the formation of the metal layer is controlled. More specifically, for example, it is preferable that the film exhibiting an absolute value of 4.0 mJ/mg or higher when an endothermic peak area attributed to melting of the crystalline thermoplastic polyimide is measured by performing a differential scanning calorimetry on the film, and that the absolute value that the film exhibits is 0.5 mJ/mg or lower when an exothermic peak area attributed to recrystallization of the crystalline thermoplastic polyimide is measured by performing the differential scanning calorimetry on the film.

In order to satisfying the conditions, the temperature at which the film and the metal foil are bonded, and the cooling rate can be appropriately controlled, as in the film production. More specifically, the crystallization state can be controlled by arranging such that the lamination is performed at a temperature close to the melting point of the thermoplastic polyimide, so as to melt the thermoplastic polyimide, and then the cooling subsequent the lamination is carried out at a cooling rate that is slower than the crystallization rate of the thermoplastic polyimide.

In order to attain a higher peeling strength for the metal layer, it is necessary to have a greater flowability of the adhesive layer. However, an adhesive layer with such a greater flowability is softened by the solder-dip temperature. This leads to deterioration of the post-moisture absorption solderability. Thus, the improvement of the peeling strength has basically required the sacrifice of the post-moisture absorption solderability, and these properties cannot be attained at high levels together. On the other hand, the flexible metal-clad laminate according to the present invention can attain both the properties, and is applicable to lead-free soldering FPCs, or multi-layer FPCs. Needless to say, the present invention is not limited to these applications, and is applicable to various usage in which a laminate with a metal layer is used.

EXAMPLES

In the following, the present invention is more specifically described with reference to Examples and Comparative Examples, to which the present invention is not limited. In Examples and Comparative Examples, melting points (Tm) and glass transition Temperatures (Tg) of thermoplastic polyimides used in an adhesive layer, water absorption coefficient of polyimide films, and post-moisture absorption solderability of flexible metal-clad laminates, and peeling strength of metal foils were measured or evaluated in the following manners.

[Melting of Thermoplastic Polyimide]

The thermoplastic polyimide precursor solution thus obtained in Synthesis Example was spread over a shin surface of a rolled copper foil (BHY-22B-T; made by Nippon Mining & Metals Co. Ltd.) of 18 μm in thickness, so that a film of the thermoplastic polyimide precursor solution was formed thereon with a thickness of 20 μm finally. Then, the film was dried at 130° C. for 3 minutes, at 200° C. for 2 minutes, at 250° C. for 2 minutes, at 300° C. for 2 minutes, or at 350° C. for 1 minutes. After the drying, the copper foil was etched away from the film. Then, the film was dried 50° C. for 30 minutes, thereby a single-layered sheet of the thermoplastic polyimide.

By using a DSC 220 made by Seiko Instruments Inc., the single-sheet of the thermoplastic polyimide was measured in a temperature program in a range from 0° C. to 450° C. with a temperature rising rate of 10° C./min and temperature dropping rate of 40° C./min, wherein aluminum was used as control. A peak of heat absorption chart in the temperature increase step was considered as a melting point. Here, when the heat absorption chart was broadened, thereby reducing its area, this phenomenon is referred to as "Broad", indicating that crystallinity was deteriorated.

[Endothermic Peak of Thermoplastic Polyimide, and Calculation of Absolute Area of Endothermic Peak]

Before bonding a metal foil thereto after bonding the metal foil thereto and then etched away the metal foil therefrom, the films thus obtained in Example were measured by using differential scanning calorimetery, after treated in the same manner as in the melting point calculation. Thereby, charts were obtained for the films. By drawing tangents line on the charts, an area of endothermic peak due to melting, and an area of exothermic peak due to crystallization were worked out for each film. When the endothermic peak is broadened, a peak area absolute value apparently increases accordingly. Thus, in case where broadening occurred, it is expressed as "broad".

[Glass Transition Temperature of Thermoplastic Polyimide]

Glass Transition temperatures of the films were measured after treating the films in the same manner as in the measurement of melting points. Inflection points of heat absorption charts during the heat increase step are considered as the glass transition temperature.

[Polyimide Film Water Absorption Coefficient]

The films were cut into a 20 cm square shape and dried at 150° C. for 30 minutes. Weights of the films after the drying are put as $W_1$. After the drying the films were immersed in pure water at 20° C. for 24 hours. Weights of the films after the immersion were put as $W_2$. Weight changes of the films were worked out from the following equation:

Water Absorption Coefficient (%)=$\{(W_2-W_1)/W_1\}\times 100$

[Post-moisture Absorption Solderability of Flexible Metal-Clad Laminate]

From each of the both-sided flexible metal-clad laminates obtained in Examples and Comparative Examples, two samples were prepared by etching an upper-side copper foil and a lower-side copper foil to a size of 1 cm×1.5 cm so that the two copper foils of this size overlap with each other. The samples thus obtained were subjected to moisture absorption treatment by being left at 400° C. for 96 hours under a moisture condition of 90% R.H. After the moisture absorption treatment, the samples were immersed in a solder bath of 250° C., 270° C., or 300° C. for 10 seconds. The samples were visually observed after one of the copper foils was etched away after the solder bathing. If a part covered with the copper foils showed no appearance change, the films were evaluated as good. If the part showed at least one of whitening of the film layer, swelling of the film layer, or peeling-off of any copper layer, the film was evaluated as poor.

[Metal-foil Peeling Strength of Flexible Metal-Clad Laminate]

According to JIS C6471 "6.5 Peeling Strength", a sample was prepared and a load was determined which peeled the metal foil in a 5 mm width from the sample at 180° peeling angle at a rate of 50 mm/min.

Synthesis Example 1

Synthesis of Thermoplastic Polyimide Precursor

Into a glass flask of 2000 ml in volume, 637.0 g of N,N-dimethylformamide (hereinafter, may be referred to as DMF), and 68.2 g of 3,3',4,4'-biphenyltetracarboxylic dianhydride (hereinafter, may be referred to as BPDA were added. Then, under nitrogen atmosphere, 20.3 g of 1,4-bis(4-aminophenoxy)benzene (hereinafter, may be referred to as TPE-Q) and 45.4 g of 1,3-bis(4-aminophenoxy)benzene (TPE-R) were added therein with stirring. Then, a mixture thus prepared was stirred at 25° C. for 1 hour, thereby obtaining a reaction solution. A DMF solution of TPE-R, in which 2.0 g of TPE-R was dissolved in 27.0 g of DMF, was separately prepared. The DMF solution was gradually added in the reaction solution with stirring, while monitoring viscosity of the reaction solution. When the viscosity of the reaction solution reached 1200 poise, the addition and stirring were stopped, thereby obtaining a polyamic acid solution.

Synthesis Example 2

Synthesis of Thermoplastic Polyimide Precursor

Into a glass flask of 2000 ml in volume, 637.2 g of DMF, and 67.8 g of BPDA were added. Then, under nitrogen atmosphere, 4.2 g of 4,4'-bis(4-aminophenoxy) biphenyl (hereinafter, may be referred to as BAPB), and 62.0 g of TPE-R were added therein with stirring. Then, a mixture thus prepared was stirred at 25° C. for 1 hour, thereby obtaining a reaction solution. A DMF solution of TPE-R, in which 2.0 g of TPE-R was dissolved in 27.0 g of DMF, was separately prepared. The DMF solution was gradually added in the reaction solution with stirring, while monitoring viscosity of the reaction solution. When the viscosity of the reaction solution reached 1200 poise, the addition and stirring were stopped, thereby obtaining a polyamic acid solution.

Synthesis Example 3

Synthesis of Thermoplastic Polyimide Precursor

Into a glass flask of 2000 ml in volume, 637.0 g of DMF, and 68.2 g of BPDA were added. Then, under nitrogen atmosphere, 65.8 g of TPE-R was added therein with stirring. Then, a mixture thus prepared was stirred at 25° C. for 1 hour, thereby obtaining a reaction solution. A DMF solution of TPE-R, in which 2.0 g of TPE-R was dissolved in 27.0 g of DMF, was separately prepared. The DMF solution was gradually added in the reaction solution with stirring, while monitoring viscosity of the reaction solution. When the viscosity of the reaction solution reached 1200 poise, the addition and stirring were stopped, thereby obtaining a polyamic acid solution.

Synthesis Example 4

Synthesis of Thermoplastic Polyimide Precursor

Into a glass flask of 2000 ml in volume, 780.0 g of DMF, and 117.2 g of bis[4-(4-aminophenoxy)phenyl]sulfone (hereinafter, may be referred to as BAPS) were added. Then, under nitrogen atmosphere, 71.7 g of BPDA was gradually added therein with stirring. After that, 5.6 g of 3,3',4,4'-ethyleneglycoldibenzoate tetracarboxylic dianhydride (hereinafter, may be referred to as TMEG) was added therein. Then, a mixture thus prepared was stirred at 25° C. for 30 minutes, thereby obtaining a reaction solution. A DMF solution of TMEG, in which 5.5 g of TMEG was dissolved in 20.0 g of DMF, was separately prepared. The DMF solution was gradually added in the reaction solution with stirring, while monitoring viscosity of the reaction solution. When the viscosity of the reaction solution reached 1500 poise, the addition and stirring were stopped, thereby obtaining a polyamic acid solution.

Synthesis Example 5

Synthesis of Thermoplastic Polyimide Precursor

Into a glass flask of 2000 ml in volume, 632.4 g of DMF, and 56.8 g of BPDA were added. Then, under nitrogen atmosphere, 76.8 g of 2,2-bis[4-(4-aminophenoxy)phenyl]propane (hereinafter, may be referred to as BAPP) was added therein with stirring. Then, a mixture thus prepared was stirred at 25° C. for 1 hour, thereby obtaining a reaction solution. A DMF solution of BAPP, in which 2.4 g of BAPP was dissolved in 31.6 g of DMF, was separately prepared. The DMF solution was gradually added in the reaction solution with stirring, while monitoring viscosity of the reaction solution. When the viscosity of the reaction solution reached 1200 poise, the addition and stirring were stopped, thereby obtaining a polyamic acid solution.

Synthesis Example 6

Synthesis of Thermoplastic Polyimide Precursor

Into a glass flask of 2000 ml in volume, 631.7 g of DMF, and 55.1 g of BPDA were added. Then, under nitrogen atmosphere, 77.7 g of BAPS was added therein with stirring. Then, a mixture thus prepared was stirred at 25° C. for 1 hour, thereby obtaining a reaction solution. A DMF solution of BAPS, in which 2.4 g of BAPS was dissolved in 32.2 g of DMF, was separately prepared. The DMF solution was gradually added in the reaction solution with stirring, while monitoring viscosity of the reaction solution. When the viscosity of the reaction solution reached 1200 poise, the addition and stirring were stopped, thereby obtaining a polyamic acid solution.

Synthesis Example 7

Synthesis of Thermoplastic Polyimide Precursor

Into a glass flask of 2000 ml in volume, 631.7 g of DMF, and 7.4 g of 3,3',4,4-benzophenonetetracarboxylic dianhydride (hereinafter, may be referred to as BTDA) were added and stirred under nitrogen atmosphere. Thereafter it was visually confirmed that BTDA was dissolved therein. Then, 6.1 g of 1,3-bis(3-aminophenoxy)benzene (hereinafter, may be referred to as APB) was added therein, followed by 30-minute stirring. After that, 61.1 g of BPDA was added therein, and then 59.3 g of TPE-R was added therein with stirring. Then, a mixture thus prepared was stirred at 25° C. for 2 hour, thereby obtaining a reaction solution. A DMF solution of TPE-R, in which 2.0 g of TPE-R was dissolved in 27.0 g of DMF, was separately prepared. The DMF solution was gradually added in the reaction solution with stirring, while monitoring viscosity of the reaction solution. When the viscosity of the reaction solution reached 1200 poise, the addition and stirring were stopped, thereby obtaining a polyamic acid solution.

Synthesis Example 8

Synthesis of Thermoplastic Polyimide Precursor

Into a glass flask of 2000 ml in volume, 636.7 g of DMF, and 7.5 g of BTDA were added and stirred under nitrogen atmosphere. Thereafter it was visually confirmed that BTDA was dissolved therein. Then, 4.2 g of 3,4'-diaminodiphenylether (hereinafter, may be referred to as 3,4'-ODA) was added therein, followed by 30-minute stirring. After that, 62.0 g of BPDA was added therein, and then 60.2 g of TPE-R was added therein with stirring. Then, a mixture thus prepared was stirred at 25° C. for 2 hour, thereby obtaining a reaction solution. A DMF solution of TPE-R, in which 2.1 g of TPE-R was dissolved in 27.0 g of DMF, was separately prepared. The DMF solution was gradually added in the reaction solution with stirring, while monitoring viscosity of the reaction solution. When the viscosity of the reaction solution reached 1200 poise, the addition and stirring were stopped, thereby obtaining a polyamic acid solution.

Synthesis Example 9

Synthesis of Thermoplastic Polyimide Precursor

Into a glass flask of 2000 ml in volume, 636.5 g of DMF, and 15.2 g of BTDA were added and stirred under nitrogen atmosphere. Thereafter it was visually confirmed that BTDA was dissolved therein. Then, 8.5 g of 3,4'-ODA was added therein, followed by 30-minute stirring. After that, 55.6 g of BPDA was added therein, and then 54.6 g of TPE-R was added therein with stirring. Then, a mixture thus prepared was stirred at 25° C. for 2 hour, thereby obtaining a reaction solution. A DMF solution of TPE-R, in which 2.1 g of TPE-R was dissolved in 27.5 g of DMF, was separately prepared. The DMF solution was gradually added in the reaction solution with stirring, while monitoring viscosity of the reaction solution. When the viscosity of the reaction solution reached 1200 poise, the addition and stirring were stopped, thereby obtaining a polyamic acid solution.

Synthesis Example 10

Synthesis of Thermoplastic Polyimide Precursor

Into a glass flask of 2000 ml in volume, 637.1 g of DMF, and 7.4 g of BTDA were added and stirred under nitrogen atmosphere. Thereafter it was visually confirmed that BTDA was dissolved therein. Then, 61.1 g of BPDA was added therein. After that, 61.1 g of BPDA was added therein, and then 6.1 g of APB and 59.3 g of TPE-R were added therein with stirring. Then, a mixture thus prepared was stirred at 25° C. for 2 hour, thereby obtaining a reaction solution. A DMF solution of TPE-R, in which 2.0 g of TPE-R was dissolved in 27.0 g of DMF, was separately prepared. The DMF solution was gradually added in the reaction solution with stirring, while monitoring viscosity of the reaction solution. When the viscosity of the reaction solution reached 1200 poise, the addition and stirring were stopped, thereby obtaining a polyamic acid solution.

Synthesis Example 11

Synthesis of Non-Thermoplastic Polyimide Precursor

Into a glass flask of 2000 ml in volume, 657.8 g of DMF, 10.5 g of 3,4'-ODA, and 32.4 g of BAPP were added and stirred at 20° C. under nitrogen atmosphere. Thereafter it was visually confirmed that they were dissolved therein. Then, 17.0 g of BTDA and 14.3 g of pyromellitic dianhydride (hereinafter, may be referred to as PMDA) were added therein, followed by 30-minute stirring. After that, 14.2 g of p-phenylenediamine (hereinafter, may be referred to as p-PDA) was further added therein, followed by 30-minute stirring. Furthermore, 30.4 g of PMDA was added therein, followed by 30-minute stirring. A DMF solution of PMDA, in which PMDA of 3 mol % was dissolved to make a solid content of 7 wt %, was prepared. The DMF solution was gradually added in the reaction solution with stirring, while monitoring viscosity of the reaction solution. When the viscosity of the reaction solution reached 2500 poise at 20° C., polymerization was terminated.

Example 1

After the polyamic acid solution obtained in Synthesis Example 1 was diluted with DMF to a solid content of 8.5 wt %, the diluted polyamic acid solution was applied on both sides of a heat-resistant polyimide film (Apical 17FP, Kaneka Corp, water absorption coefficient 1.4%) of 17 μm thickness, so as to make a thermoplastic polyimide layer (to be an adhesive layer) of 4 μm final thickness on each side. Then, a laminate thus prepared was heated at 140° C. for 1 minute. Then, the laminate was subjected to heat treatment of 390° C. for 20 seconds for imidization, thereby obtaining a film.

On each side of the film thus prepared, a rolled copper foil of 18 μm thickness (BHY-22B-T; Nippon Mining & Metals Co. Ltd.) was provided. Then, a protective material (Apical 125NPI; Kanaka Corp.) was provided on the top of each copper foil. This laminate thus prepared was subjected to continuous thermal lamination with a lamination temperature of 380° C., laminate pressure of 196N/cm (20 kgf/cm), and laminate rate 1.5 m/min, by using a heat roll laminating apparatus. Thereby, a flexible metal-clad laminate according to the present invention was obtained.

Example 2

A film and a flexible metal-clad laminate were obtained in the same manner as in Example 1, except that the polyamic acid solution obtained in Synthesis Example 2 was used instead of the polyamic acid solution obtained in Synthesis Example 1.

Example 3

A film and a flexible metal-clad laminate were obtained in the same manner as in Example 1, except that the polyamic acid solution obtained in Synthesis Example 3 was used instead of the polyamic acid solution obtained in Synthesis Example 1.

Example 4

After the polyamic acid solution obtained in Synthesis Example 7 was diluted with DMF to a solid content of 14 wt %, an imidization accelerator was added to the diluted polyamic acid solution by 50% weight ratio, the imidization accelerator containing acetic anhydride/isoquinoline/DMF (at a weight ratio of 1.0/0.3/4.0). Then, the diluted polyamic acid solution was applied on both sides of a heat-resistant polyimide film (Apical 17FP, Kaneka Corp, water absorption coefficient 1.4%) of 17 μm thickness, so as to make a thermoplastic polyimide layer (to be an adhesive layer) of 4 μm final thickness on each side. Then, a laminate thus prepared was heated at 140° C. for 1 minute. Then, the laminate was subjected to heat treatment of 250° C. for 10 seconds, 350° C. for 10 seconds, 450° C. for 10 seconds, 350° C. for 5 seconds, and then 250° C. for 5 seconds for imidization, thereby obtaining a film.

On each side of the film thus prepared, a rolled copper foil of 18 μm thickness (BHY-22B-T; Nippon Mining & Metals Co. Ltd.) was provided. Then, a protective material (Apical 125NPI; Kanaka Corp.) was provided on the top of each copper foil. This laminate thus prepared was subjected to continuous thermal lamination with a lamination temperature of 340° C., laminate pressure of 196N/cm (20 kgf/cm), and laminate rate 1.5 m/min, by using a heat roll laminating apparatus. Thereby, a flexible metal-clad laminate according to the present invention was obtained.

Example 5

A film and a flexible metal-clad laminate were obtained in the same manner as in Example 4, except that the polyamic acid solution obtained in Synthesis Example 8 was used instead of the polyamic acid solution obtained in Synthesis Example 7.

Example 6

A film and a flexible metal-clad laminate were obtained in the same manner as in Example 4, except that the polyamic acid solution obtained in Synthesis Example 9 was used instead of the polyamic acid solution obtained in Synthesis Example 7.

Example 7

To the polyamic acid solution obtained in Synthesis Example 11, an imidization accelerator containing acetic anhydride/isoquinoline/DMF (at a weight ratio of 2.0/0.3/4.0) was added by 45% weight ratio. A mixture thus prepared was stirred with a mixer, thereby obtaining a dope solution 1. Meanwhile, the polyamic acid solution obtained in Synthesis Example 1 was diluted with DMF to 300 poise, thereby obtaining a dope solution 2. The dope solutions 1 and 2 were co-extruded via a three-layer die so as to extrude the dope solution 2 on top of both sides of the dope solution 1. The extruded dope solutions 1 and 2 were flow-cast onto an endless belt made of stainless steel, thereby obtaining a flow-cast film was heated at 130° C. for 100 seconds. Then, a self-supporting gel film (volatile content: 30 wt %) thus prepared was peeled off from the endless belt and tendered. Then, the gel film was subjected to heat treatment of 250° C. for 10 seconds, 350° C. for 10 seconds, and then 450° C. for 15 seconds for drying and imidization, thereby obtaining a film of 14 μm thickness. The film was treated in the same manner as in Example 1, so as to obtain a flexible metal-clad laminate.

Comparative Example 1

A film and a flexible metal-clad laminate were obtained in the same manner as in Example 1, except that the polyamic acid solution obtained in Synthesis Example 4 was used instead of the polyamic acid solution obtained in Synthesis Example 1.

Comparative Example 2

A film and a flexible metal-clad laminate were obtained in the same manner as in Example 1, except that the polyamic acid solution obtained in Synthesis Example 5 was used instead of the polyamic acid solution obtained in Synthesis Example 1.

Comparative Example 3

A film and a flexible metal-clad laminate were obtained in the same manner as in Example 1, except that the polyamic acid solution obtained in Synthesis Example 6 was used instead of the polyamic acid solution obtained in Synthesis Example 1. The flexible metal-clad laminate, whose copper foil was easily peeled off, was not evaluated in terms of post-moisture absorption solderability.

Comparative Example 4

A film and a flexible metal-clad laminate were obtained in the same manner as in Example 4, except that the polyamic acid solution obtained in Synthesis Example 10 was used instead of the polyamic acid solution obtained in Synthesis Example 7.

In Tables 1 and 2, melting points (Tm) and glass transition temperature (Tg) of the thermal plastic polyimides used for the adhesive layers of the films, and properties of the flexible metal-clad laminates obtained in the Examples and Comparative Examples are shown.

TABLE 1

|  | Tg (° C.) | Tm (° C.) | Post-Moisture Absorption Solderability | | | Metal Foil Peeling Strength (N/cm) |
|---|---|---|---|---|---|---|
|  |  |  | 250° C. | 270° C. | 300° C. |  |
| Ex. 1 | 230 | 400 | good | good | good | 14 |
| Ex. 2 | 211 | 392 | good | good | good | 15 |
| Ex. 3 | 210 | 395 | good | good | good | 15 |
| Ex. 4 | 205 | 371 | good | good | good | 13 |
| Ex. 5 | 205 | 373 | good | good | good | 14 |
| Ex. 6 | 200 | 368 | good | good | good | 15 |
| Ex. 7 | 230 | 400 | good | good | good | 16 |
| Com. Ex. 1 | 270 | — | good | good | poor | 13 |
| Com. Ex. 2 | 240 | — | good | poor | poor | 12 |
| Com. Ex. 3 | 285 | — | — | — | — | — |
| Com. Ex. 4 | 200 | Broad | good | poor | poor | 10 |

Abbreviation:
"Ex." stands for Example.
"Com. Ex." stands for Comparative Example.

TABLE 2

|  | Absolute Value of Peak Area before metal foil bonding (mJ/mg) | | Absolute Value of Peak Area after metal foil bonding (mJ/mg) | |
|---|---|---|---|---|
|  | EPR | EPM | EPR | EPM |
| Ex. 1 | 2.4 | 8.5 | 0.0 | 8.0 |
| Ex. 2 | 1.8 | 8.0 | 0.0 | 7.8 |
| Ex. 3 | 2.0 | 8.5 | 0.0 | 8.0 |
| Ex. 4 | 1.7 | 5.0 | 0.1 | 6.5 |
| Ex. 5 | 2.0 | 5.0 | 0.1 | 6.5 |
| Ex. 6 | 1.5 | 5.5 | 0.1 | 6.0 |
| Ex. 7 | 0.2 | 6.5 | 0.0 | 6.0 |
| Com. Ex. 1 | — | — | — | — |
| Com. Ex. 2 | — | — | — | — |
| Com. Ex. 3 | — | — | — | — |
| Com. Ex. 4 | 4.5 | Broad | 4.5 | Broad |

Abbreviation:
"Ex." stands for Example.
"Com. Ex." stands for Comparative Example.
"EPR" stands for Exothermic Peak due to Recrystallization.
"EPM" stands for Endothermic Peak due to Melting.

As shown in the Comparative Examples, the flexible metal-clad laminates each comprising a film whose adhesive layer was prepared from a non-crystalline thermoplastic polyimide showed better post-moisture absorption solderability with higher glass transition temperature of the adhesive layer. However, the adhesion with respect to the metal foil was impractically poor in the flexible metal-clad laminates with an excessively high glass transition temperature.

Meanwhile, the Examples in each of which a film whose adhesive layer was prepared from a crystalline thermoplastic polyimide showed glass transition temperatures lower than those provided by the non-crystalline thermoplastic polyimide. However, the Examples showed excellent post-moisture absorption solderability together with sufficient metal-foil peeling strength (i.e., the adhesion between the metal foil and the film).

Moreover, compared with Examples 1 to 3, Examples 4 to 6 in which a particular polymerization method was used for the polymerization of the thermoplastic polyimide precursors showed melting points lower by 20° C. to 25° C., and excellent post-moisture absorption solderability and metal-foil peeling strength even though the lamination was carried out with such a low temperature of 340° C. Thus, Examples 4 to 6 were improved in processability without sacrificing the properties.

This result overturns the conventional knowledge that "comprising a film with an adhesive layer of a higher glass transition temperature improves the post-moisture absorption solderability but inevitably deteriorates the processability in exchange". The present invention is expected to be applicable to fields where higher post-moisture absorption solderability is required.

The invention claimed is:
1. A film, comprising:
   a heat-resistant polyimide film; and
   an adhesive layer on at least one side surface of the heat-resistant polyimide film, wherein the adhesive layer comprises a crystalline thermoplastic polyimide,
   wherein the film shows an endothermic peak area attributed to melting of the crystalline thermoplastic polyimide in differential scanning calorimetry, and an absolute value of the endothermic peak area is 4.0 mJ/mg or higher,
   wherein the crystalline thermoplastic polyimide is produced by a process comprising imidizing a polyamic acid obtained by reacting at least one diamine component and a dianhydride component,
   wherein the at least one diamine component is selected from the group consisting of 1,4-bis(4-aminophenoxy)benzene, 1,3-bis(4-aminophenoxy)benzene, 4,4'-bis(4-aminophenoxy)biphenyl, and
   wherein the dianhydride component is 3,3',4,4'-biphenyl tetra carboxylic dianhydride.
2. The film according to claim 1, wherein the film shows an exothermic peak area attributed to recrystallization of the crystalline thermoplastic polyimide in differential scanning calorimetry, and an absolute value of the exothermic peak area is 4.0 mJ/mg or lower.
3. The film according to claim 1, wherein the crystalline thermoplastic polyimide has a melting point of from 340° C. to 450° C.
4. The film according to claim 1, wherein the heat-resistant polyimide film has a water absorption coefficient of 1.5% or lower.
5. The film according to claim 1, wherein an amount of the crystalline thermoplastic polyimide is from 85 wt % to 100 wt % with respect to a thermoplastic polyimide contained in the adhesive layer.
6. The film according to claim 1, wherein the crystalline thermoplastic polyimide has a melting point of from 340° C. to 380° C.
7. A flexible metal-clad laminate, comprising:
   the film of claim 1; and
   a metal layer formed on at least one side surface of the film.
8. The flexible metal-clad laminate according to claim 7, which has both of the following properties (i) and (ii):
   (i) a peeling strength for the metal layer is 10 N/cm or greater, where a force to peel the metal layer is applied in a 180 degrees direction; and
   (ii) defective appearance that includes swelling and whitening does not occur even if being exposed under a moisture condition of 40° C. of temperature and 90% R.H. for 96 hours and thereafter immersed in solder dip of 300° C. for 10 seconds.

9. The flexible metal-clad laminate according to claim 7, wherein the flexible metal-clad laminate is such that the film resulting from removal of the metal layer shows, by differential scanning calorimetry, an endothermic peak area attributed to melting of the crystalline thermoplastic polyimide and an exothermic peak area attributed to recrystallization of the crystalline thermoplastic polyimide, an absolute value of the endothermic peak is 4.0 mJ/mg or higher, and an absolute value of the exothermic peak area is 0.5 mJ/mg or lower.

10. The film according to claim 1, wherein the crystalline thermoplastic polyimide is produced by a process comprising imidizing a polyamic acid obtained by reacting 4,4'-bis(4-aminophenoxy)biphenyl and 3,3',4,4'-biphenyl tetra carboxylic dianhydride.

11. The film according to claim 1, wherein the crystalline thermoplastic polyimide is produced by a process comprising imidizing a polyamic acid obtained by reacting 1,4-bis(4-aminophenoxy)benzene and 1,3-bis(4-aminophenoxy)benzene, and 3,3',4,4'- biphenyl tetra carboxylic dianhydride.

12. The film according to claim 1, wherein the crystalline thermoplastic polyimide is produced by a process comprising imidizing a polyamic acid obtained by reacting 4,4'-bis(4-aminophenoxy)biphenyl and 1,3-bis(4-aminophenoxy)benzene, and 3,3',4,4'-biphenyl tetra carboxylic dianhydride.

13. The film according to claim 1, wherein the crystalline thermoplastic polyimide is produced by a process comprising imidizing a polyamic acid obtained by reacting 1,3-bis(4-aminophenoxy)benzene and 3,3',4,4'-biphenyl tetra carboxylic dianhydride.

* * * * *